(12) United States Patent
Suzuki et al.

(10) Patent No.: US 8,390,076 B2
(45) Date of Patent: Mar. 5, 2013

(54) SEMICONDUCTOR DEVICE AND MANUFACTURING METHOD THEREOF

(75) Inventors: Atsuhiro Suzuki, Yokohama (JP); Hiroshi Shimode, Yokkaichi (JP); Takeshi Shimane, Matsudo (JP); Norihisa Arai, Saitama (JP); Minori Kajimoto, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 698 days.

(21) Appl. No.: 12/420,363

(22) Filed: Apr. 8, 2009

(65) Prior Publication Data

US 2009/0256190 A1 Oct. 15, 2009

(30) Foreign Application Priority Data

Apr. 9, 2008 (JP) ................................. 2008-101379

(51) Int. Cl.
*H01L 21/70* (2006.01)
(52) U.S. Cl. ................................. 257/390; 257/E27.102
(58) Field of Classification Search .................. 257/316, 257/317, E29.3, E21.548, 514, 519, 350, 257/374, 501, E27.081, 390, 510, E27.102
See application file for complete search history.

(56) References Cited

U.S. PATENT DOCUMENTS

| | | | | |
|---|---|---|---|---|
| 5,780,894 | A * | 7/1998 | Hazama | 257/326 |
| 5,818,756 | A | 10/1998 | Sakui et al. | |
| 6,342,715 | B1 * | 1/2002 | Shimizu et al. | 257/314 |
| 6,483,136 | B1 | 11/2002 | Yoshida et al. | |
| 6,737,335 | B2 * | 5/2004 | Choi et al. | 438/424 |
| 7,119,413 | B2 | 10/2006 | Kutsukake et al. | |
| 2002/0054226 | A1 | 5/2002 | Lee | |
| 2003/0205756 | A1 * | 11/2003 | Ichige et al. | 257/315 |
| 2005/0151168 | A1 * | 7/2005 | Sasago et al. | 257/208 |
| 2005/0265109 | A1 * | 12/2005 | Goda et al. | 365/230.06 |
| 2006/0038232 | A1 * | 2/2006 | Kutsukake et al. | 257/365 |
| 2006/0071293 | A1 * | 4/2006 | Ichige et al. | 257/509 |

(Continued)

FOREIGN PATENT DOCUMENTS

| | | |
|---|---|---|
| JP | 62-200767 | 9/1987 |
| JP | 10-032255 | 2/1998 |

(Continued)

OTHER PUBLICATIONS

U.S. Appl. No. 13/198,081, filed Aug. 4, 2011, Inoue, et al.

(Continued)

*Primary Examiner* — Matthew Landau
*Assistant Examiner* — Latanya N Crawford
(74) *Attorney, Agent, or Firm* — Oblon, Spivak, McClelland, Maier & Neustadt, L.L.P.

(57) ABSTRACT

According to an aspect of the present invention, there is provided a semiconductor device including: a semiconductor substrate; active areas with island-like shapes formed on the semiconductor substrate; an element isolation area surrounding the active areas and including an element isolation groove formed on the semiconductor substrate and an element isolation film embedded into the element isolation groove; gate insulating films each formed on corresponding one of the active areas and having a first end portion that overhangs from the corresponding active area onto the element isolation area at one side and a second end portion that overhangs from the corresponding active area onto the element isolation area at the other side, wherein an overhang of the first end portion has a different length from a length of an overhang of the second end portion.

12 Claims, 14 Drawing Sheets

U.S. PATENT DOCUMENTS

2007/0001214 A1* 1/2007 Park .............................. 257/315
2008/0067576 A1* 3/2008 Yaegashi ....................... 257/316

FOREIGN PATENT DOCUMENTS

| JP | 2006-59978 | 3/2006 |
|---|---|---|
| JP | 2006-196838 | 7/2006 |
| JP | 2006-245625 | 9/2006 |

OTHER PUBLICATIONS

Office Action mailed Nov. 20, 2012 in Japanese Patent Application No. 2008-101379 filed Apr. 9, 2008 (with English translation).

* cited by examiner

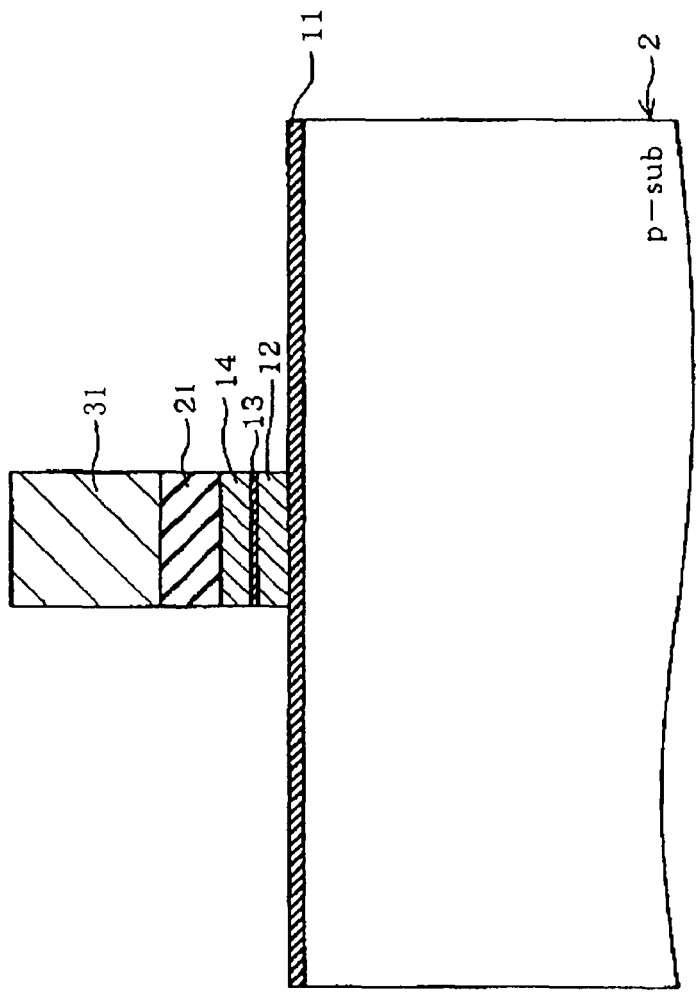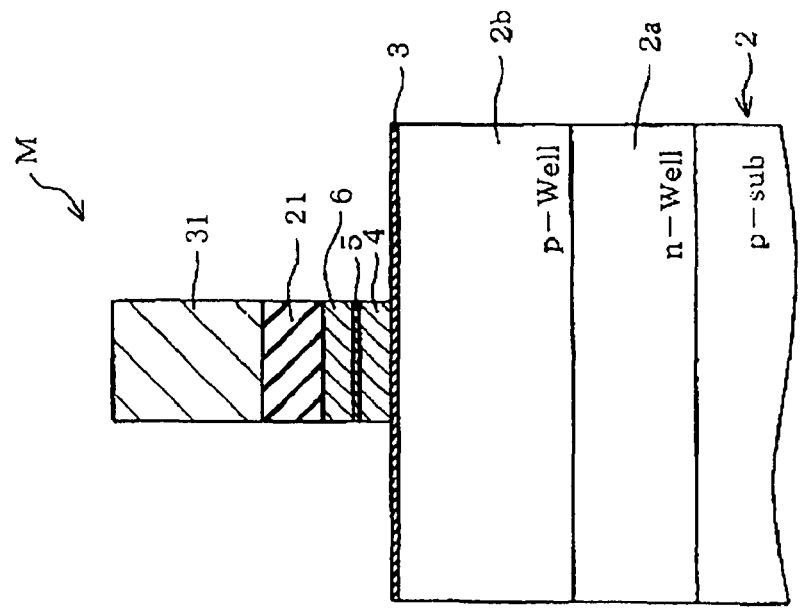

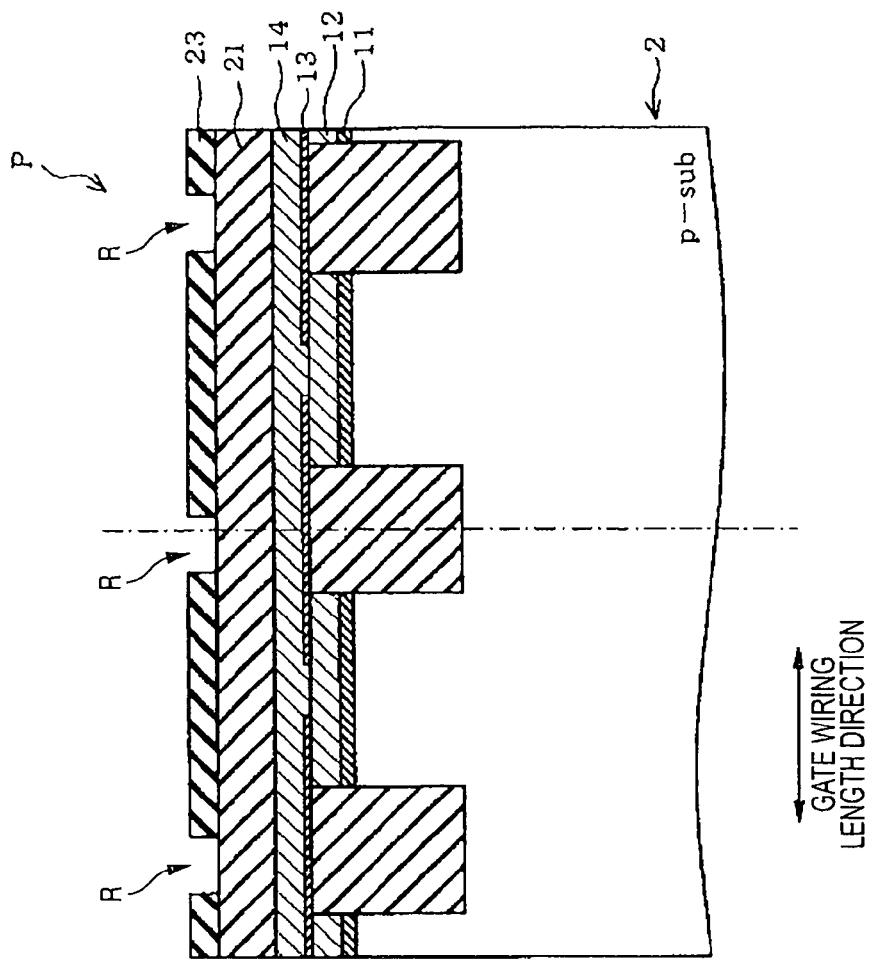
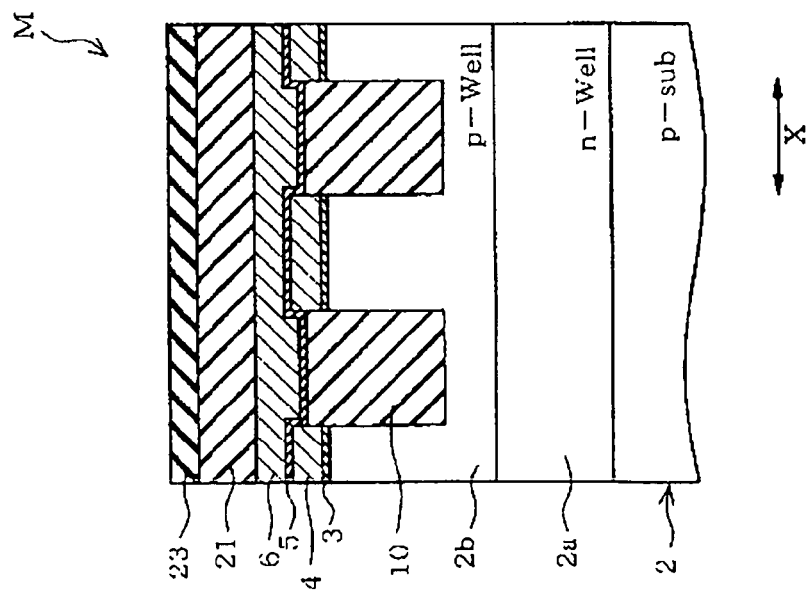

SEMICONDUCTOR DEVICE AND MANUFACTURING METHOD THEREOF

CROSS-REFERENCE TO RELATED APPLICATIONS

This application claims priority from Japanese Patent Application No. 2008-101379 filed on Apr. 9, 2008, the entire contents of which are incorporated herein by reference.

BACKGROUND OF THE INVENTION

1. Field of the Invention

An aspect of the present invention relates to a semiconductor device including transistors such as insulated gate field effect transistors and a manufacturing method of the semiconductor device.

2. Description of the Related Art

To reduce the leakage current through element isolation area between the transistors, such as insulated gate field effect transistors for making up a semiconductor circuit, it is proposed to provide a polysilicon wiring pattern for shield between the adjacent transistors (For example, refer to JP-2006-059978-A).

However, to realize a sufficient dielectric isolation capability by use of a shield polysilicon wiring pattern, it is required to provide a sufficient area between a gate electrode and the shield polysilicon wiring pattern so as not to come in structural contact with each other. If the provided area is not sufficient, the dielectric isolation capability is degraded. Thus, a large leakage current occurs at an electric-field-applied portion between the shield polysilicon wiring pattern and the gate electrode wiring, and the yield is remarkably degraded.

Although the chip area is reduced in accordance with the recent reducing trend of the design rules, for ensuring process and lithography process margin, it is difficult to reduce the size of such pattern. Further, if the chip area is reduced, it is also feared that a short circuit may occur at such pattern due to dust or contamination mixed thereinto during the manufacturing process.

To reduce the leakage current in the electric-field-applied portion of an element isolation region, it is considered to make the element isolation region further deeper. However, if an STI-structure element isolation region is made deeper, the volume of the element isolation region increases, and the stress of a semiconductor substrate may become strong, thereby causing a DC failure (standby failure). On the other hand, if the element isolation region is made shallow to decrease the volume of an embedded material in the element isolation region and to decrease the stress, the leakage current in the electric-field-applied portion may be increased.

SUMMARY OF THE INVENTION

According to an aspect of the present invention, there is provided a semiconductor device including: a semiconductor substrate; a plurality of active areas with island-like shapes formed on the semiconductor substrate; an element isolation area configured to surround the plurality of active areas, the element isolation area including an element isolation groove formed on the semiconductor substrate and an element isolation film embedded into the element isolation groove; a plurality of gate insulating films, each gate insulating film formed on corresponding one of the plurality of active areas, respectively; and a plurality of gate electrodes, each gate electrode formed on corresponding one of the plurality of gate insulating films, respectively, and having a first end portion that overhangs from the corresponding active area onto the element isolation area at one side and a second end portion that overhangs from the corresponding active area onto the element isolation area at the other side, wherein an overhang of the first end portion has a different length from a length of an overhang of the second end portion.

According to another aspect of the present invention, there is provided a semiconductor device including: semiconductor substrate; a first active area formed on the semiconductor substrate; a shallow trench isolation configured to surround the first active area; a first gate insulating film formed on the first active area; and a first gate electrode formed on the first gate insulating film, which has a first projection portion above the shallow trench isolation at one side and a second projection portion above the shallow trench isolation at the other side, wherein the first projection portion has a different length in a direction of the gate electrode from a length of the second projection portion.

According to still another aspect of the present invention, there is provided a method for manufacturing a semiconductor device, the method including: forming a plurality of active areas having island-like shapes surrounded by an element isolation groove on a semiconductor substrate; embedding an element isolation film into the element isolation groove so as to be adjacent to the plurality of active areas; forming a plurality of gate insulating films respectively on the plurality of active areas; forming gate electrode material films on the plurality of element isolation films and the plurality of gate insulating films; forming mask patterns of a plurality of gate electrodes on the gate electrode material films; and performing an etching process on the gate electrode material films by use of the mask patterns, thereby forming a plurality of gate electrodes that respectively correspond to the plurality of active areas; and each includes: a first end portion that overhangs onto the element isolation film at one side in a first length; and a second end portion that overhangs onto the element isolation film at the other side in a second length that is different from the first length.

BRIEF DESCRIPTION OF THE DRAWINGS

FIGS. 7A and 7B are cross-sectional views illustrating a manufacturing step, FIG. 7B being taken along line C-C in FIG. 6A, FIG. 7B being taken along line D-D in FIG. 6B.

FIGS. 9A and 9B are cross-sectional views in a manufacturing step, FIG. 9A showing the memory cell area, FIG. 9B showing the peripheral circuit area.

DETAILED DESCRIPTION OF THE INVENTION

First Embodiment

A first embodiment of the invention applied to the structure of a word line transfer transistor section forming a peripheral circuit area of a NAND-type flash memory unit will be discussed with reference to the accompanying drawings.

Figure 1:
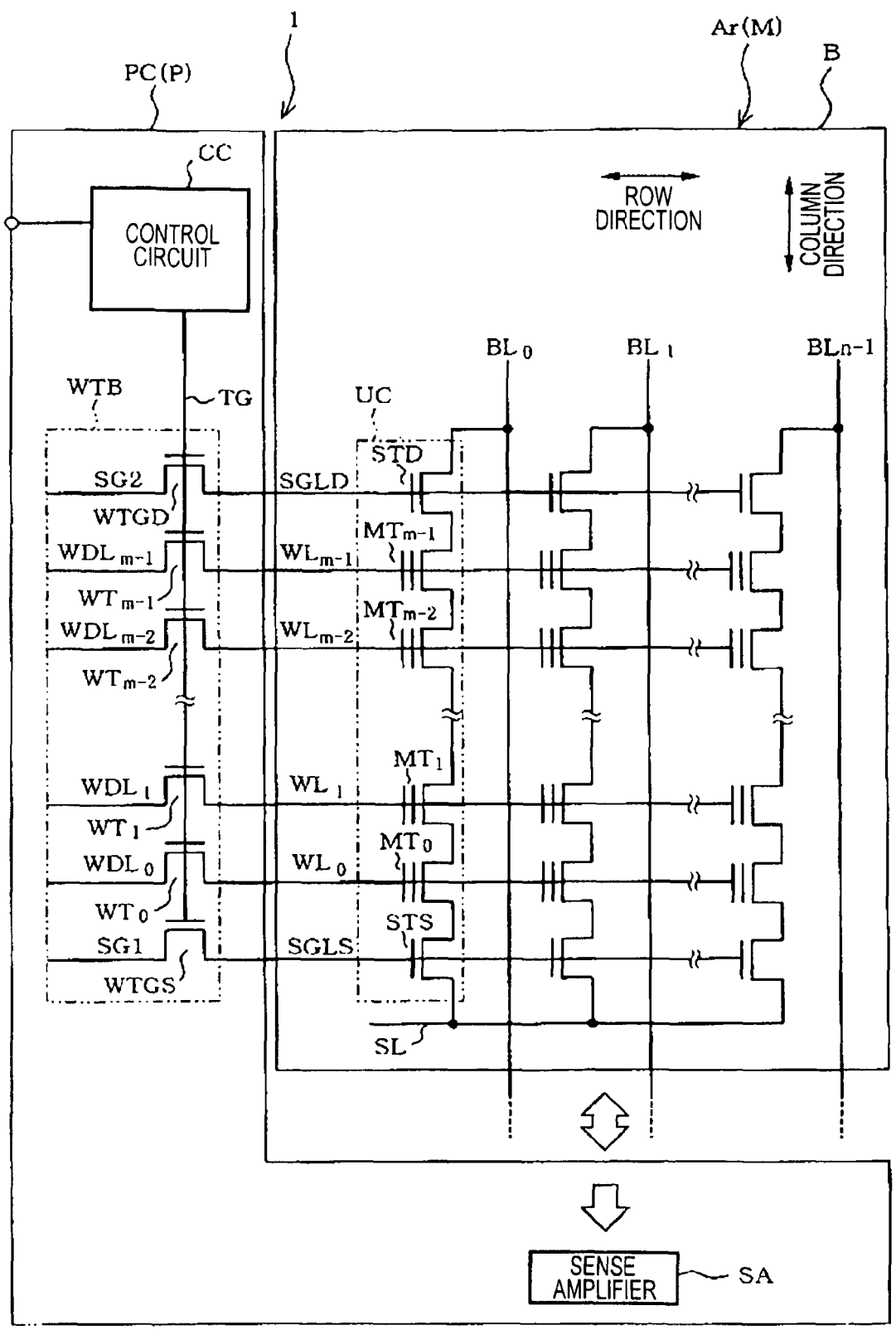
FIG. 1 is an electric configuration diagram illustrating a first embodiment of the invention.

FIG. 1 is an electric configuration diagram of the NAND-type flash memory unit.

As shown in FIG. 1, the flash memory unit 1 is made up of a memory cell array Ar made up of a large number of memory cells disposed in a matrix and a peripheral circuit PC for reading, writing, and erasing each of the memory cells of the memory cell array Ar. The memory cell array Ar is formed in a memory cell area M and the peripheral circuit PC is formed in a peripheral circuit area P.

The memory cell array Ar in the memory cell area M is configured by a large number of cell units UC. Each of the cell units UC is made up of a select gate transistor STD connected to one of bit lines $BL_0 \ldots BL_{n-1}$, a select gate transistor STS connected to a source line SL, and $m=2^k$ (for example, m=32) memory cell transistors $MT_0$ to $MT_{m-1}$ connected in series between the two (or plurality of) select gate transistors STD and STS.

The cell units UC are arranged as n columns in parallel in the row direction, thereby making up one block B. The memory cell array Ar is configured by a plurality of blocks B arranged in the column direction. The memory cell array Ar is shown as a single configuration in the embodiment, but may be divided into planes.

The peripheral circuit area P is provided on the periphery of the memory cell area M, and the peripheral circuit PC is formed on the periphery of the memory cell array Ar. The peripheral circuit PC is made up of a control circuit CC, a word line transfer transistor section WTB of a high voltage system, electrically connected to the control circuit CC, and a sense amplifier SA.

The transfer transistor section WTB includes a transfer gate transistor WTGD provided correspondingly with the select gate transistor STD, a transfer gate transistor WTGS provided correspondingly with the select gate transistor STS, and word line transfer gate transistors $WT_0$ to $WT_{m-1}$ (hereinafter, WT as required) provided correspondingly with the memory cell transistors $MT_0$ to $MT_{m-1}$. The transfer transistor sections WTB are provided in a one-to-one correspondence with the blocks B.

When an address signal is given to the control circuit CC, the control circuit CC boosts a drive voltage (for example, 20 V) as required by a boosting circuit (not shown in FIG. 1) and supplies a given voltage to a gate of each of the transfer gate transistors WTGD, WTGS, and WT through a transfer gate line TG, thereby selecting one of the blocks B. The boosting circuit, for example, is disclosed in detail in FIG. 1, FIG. 3 and the descriptions thereof of U.S. Pat. No. 5,818,756, which are incorporated herein by reference.

The transfer gate transistor WTGD has a drain and a source, one of which is connected to a select gate driver line SG2 and the other of which is connected to a select gate line SGLD. The transfer gate transistor WTGS has a drain and a source, one of which is connected to a select gate driver line SG1 and the other of which is connected to a select gate line SGLS.

The transfer gate transistors $WT_0$ to $WT_{m-1}$ each has a drain and a source, one of which is connected to the corresponding one of word line drive signal lines $WDL_0$ to $WDL_{m-1}$ and the other of which is connected to the corresponding one of word lines $WL_0$ to $WL_{m-1}$ provided in the memory cell array Ar (memory cell area M).

The select gate transistor STD of the cell units UC arranged in the row direction has a gate electrode (select gate electrode SGD; see FIG. 2) electrically connected by the select gate line SGLD. The select gate transistor STS of the cell units UC arranged in the row direction has a gate electrode (select gate electrode SGS; see FIG. 2) electrically connected by the select gate line SGLS.

The memory cell transistors $MT_0$ to $MT_{m-1}$ of the cell units UC arranged in the row direction have gate electrodes (control gate electrodes CGs; see FIG. 2) electrically connected by the word lines $WL_0$ to $WL_{m-1}$. The select gate transistor STS of the cell units UC arranged in the row direction has a source connected to a common source line SL. The source line SL is electrically connected to a source line driver (not shown). The sense amplifier SA is connected to the bit lines $BL_0$ to $BL_{n-1}$ and connects a latch circuit for temporarily retaining data when the data is read.

Figure 2:
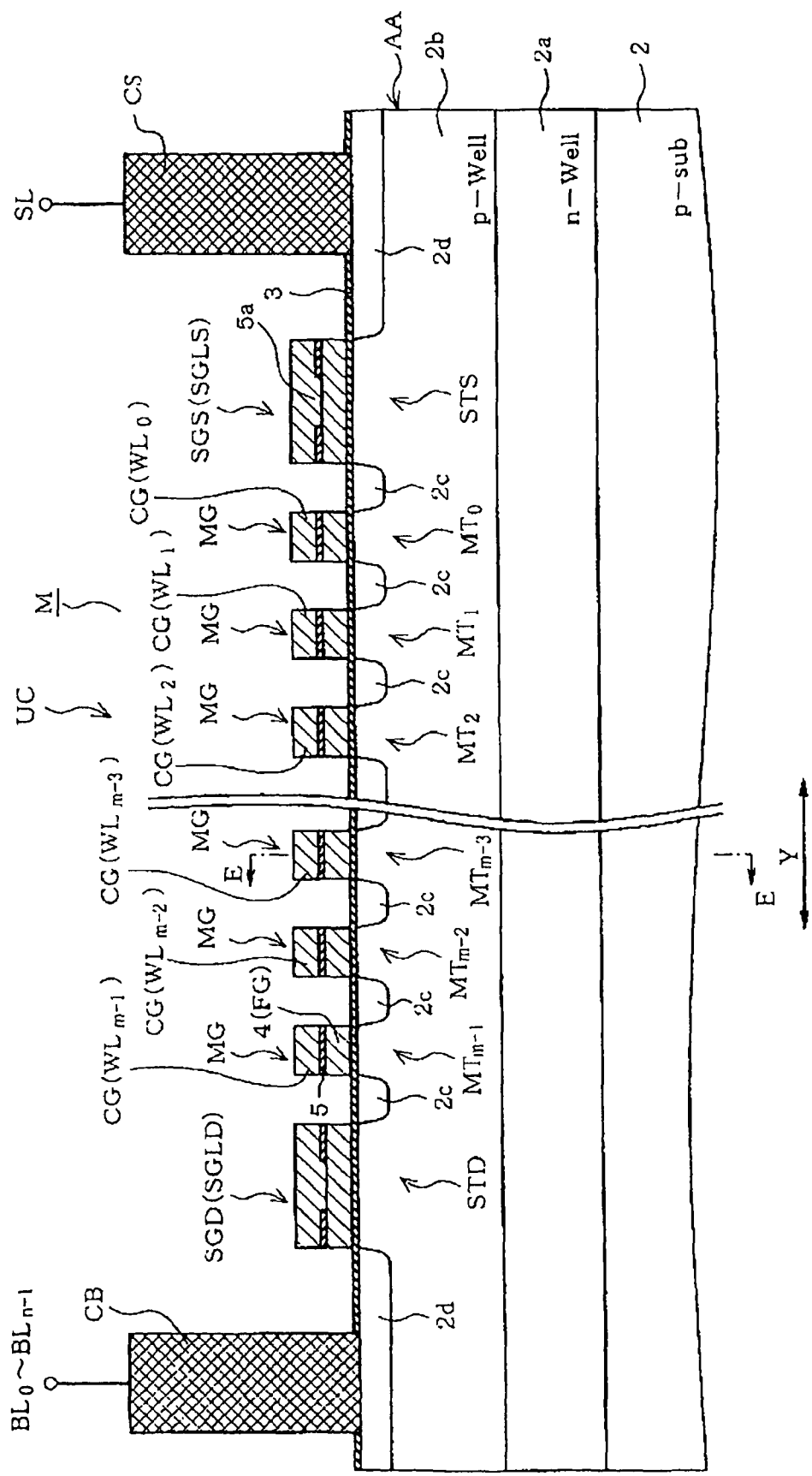
FIG. 2 is a cross-sectional view illustrating a cell unit in a longitudinal direction.

FIG. 2 illustrates a cross-sectional structure of the cell unit UC. An n well region 2a is formed on a surface layer of a p-type silicon substrate 2, and a p well region 2b is formed on the n well region 2a. The select gate transistors STD and STS and the memory cell transistors $MT_0$ to $MT_{m-1}$ (hereinafter, MT as required) are formed in the p well region 2b. Such structure enables to adapt a high voltage for erasing operation to the p well region 2b.

The select gate electrodes SGD and SGS of the select gate transistors STD and STS are formed on the p well region 2b through a gate insulating film 3 to be separated from each other in a Y direction, and gate electrodes MG of the memory cell transistors $MT_0$ to $MT_{m-1}$ are formed on the p well region 2b through the gate insulating film 3 along the Y direction between the select gate electrodes SGD and SGS.

The gate electrode MG of the memory cell transistor MT has a stack gate structure made up of a floating gate FG made of a polysilicon layer 4, for example, an inter-gate insulating film 5 made of an ONO film, for example, and a control gate electrode CG formed on the inter-gate insulating film 5.

The structure of each of the select gate electrode SGD of the select gate transistor STD and the select gate electrode SGS of the select gate transistor STS is almost similar to the structure of the gate electrode MG of each of the memory cell transistors $MT_0$ to $MT_{m-1}$; the inter-gate insulating film 5 is formed with an opening 5a and the floating gate FG and the control gate electrode CG of the gate electrode MG are in structural and electric contact with each other.

An impurity diffusion layer 2c which becomes source/drain is formed on a surface layer of the p well region 2b between the gate electrodes MG and MG, between the gate electrodes MG and SGD, and between the gate electrodes MG and SGS. A high-density impurity diffusion layer 2d is formed as a contact region on the surface layer of the p well region 2b on the drain side of the select gate electrode SGD, and the bit lines $BL_0$ to $BL_{n-1}$ are formed through a bit line contact CB on the diffusion layer $2d$.

A high-density impurity diffusion layer $2d$ is formed on the surface layer of the p well region $2b$ as a contact region at the source side of the select gate electrode SGS, and the source line SL is formed above the diffusion layer $2d$ through a source line contact CS.

Figure 3:
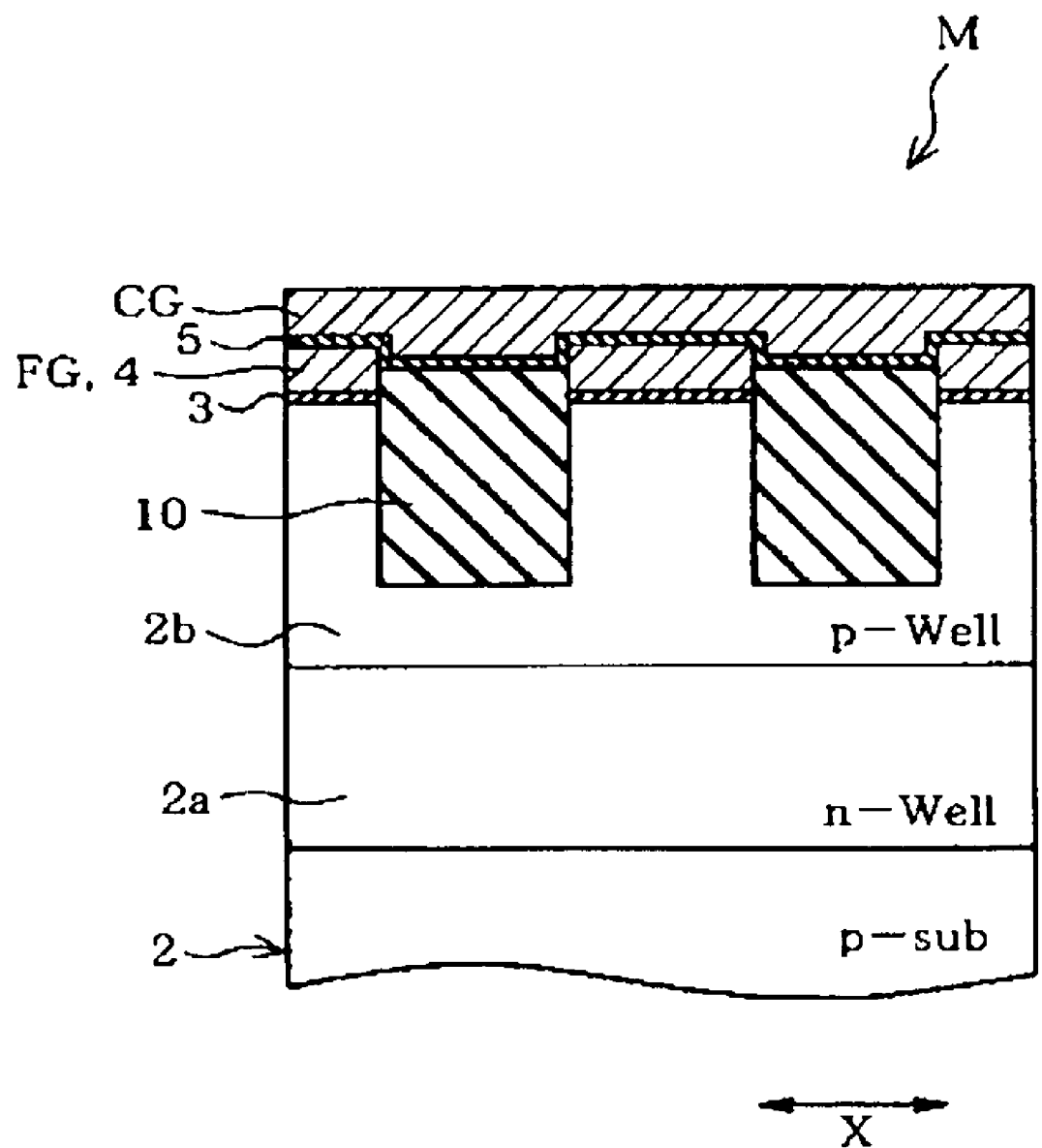
FIG. 3 is a cross-sectional view taken along line E-E in FIG. 2.

FIG. 3 schematically shows the cross section of the gate electrode portion taken along line E-E in FIG. 2 showing the memory cell area structure. As shown in FIG. 3, an element isolation film 10 is formed in the p well region $2b$ of the silicon substrate 2. The element isolation film 10 contains a silicon oxide film, embedded in an element isolation groove formed in a surface layer of the silicon substrate 2 and projects upward from the top face of the silicon substrate 2. An upper side-face of the element isolation film 10 is formed to contact with the lower side-face of the polysilicon layer 4 (floating gate electrode FG) and a side-face of the gate insulating film 3 adjacent in an X direction (crossing the Y direction). The inter-gate insulating film 5 is formed along the top face of the floating gate electrode FG, the upper side-face of the floating gate electrode FG and the top face of the element isolation film 10. The control gate electrode CG is formed on the inter-gate insulating film 5 and they are connected by the word line WL.

As shown in FIG. 1, at the writing, reading, or erasing time, the peripheral circuit PC applies a given voltage, as required, to the select gate driver line SG1, SG2, the word line drive signal lines $WDL_0$ to $WDL_{m-1}$, the p well region $2b$, the bit lines $BL_0$ to $BL_{n-1}$ in response to the writing, reading, or erasing time, and also applies a select signal (voltage) to select a block B by an address decoder ADC from the transfer gate line TG to the gate of each transfer gate transistor WTGD, WTGS, WT of the transfer transistor section WTB corresponding to the selected block, thereby transferring the signal from the driver line SG1, SG2, the word line drive signal lines $WDL_0$ to $WDL_{m-1}$ to the select gate line SGLD, SGLS and the word lines $WL_0$ to $WL_{m-1}$ in the selected block B.

Figure 4A:
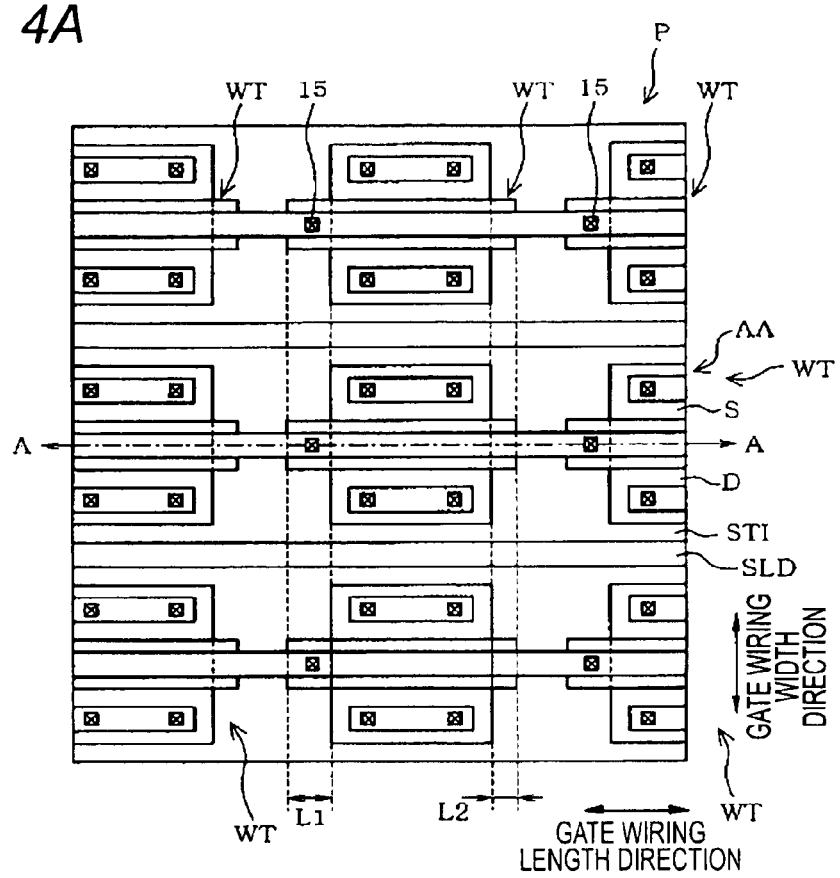
FIG. 4A is a plan view partially illustrating the peripheral circuit area.
Figure 4B:
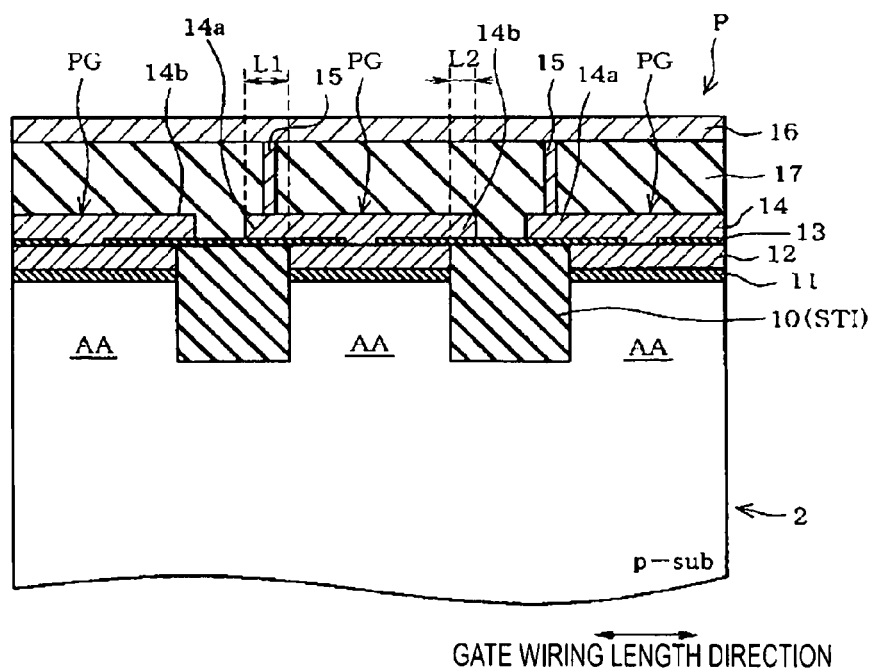
FIG. 4B is a cross-sectional view taken along line A-A in FIG. 4A.

FIG. 4A is a plan view illustrating an arrangement of the transfer gate transistors, and FIG. 4B is a cross-sectional view taken along line A-A in FIG. 4A (along a length direction of a gate wiring).

As shown in FIG. 4B, shallow-trench element isolation regions STI are provided in the surface layer of the silicon substrate 2, and the transfer gate transistors WT having a high voltage characteristic are formed for each of active areas AA isolated by the element isolation regions STI from one another. The transfer gate transistors WT are provided side by side in a pre-determined direction (gate wiring length direction) and a plurality of rows of the transfer gate transistors WT are arranged in an orthogonal direction (gate wiring width direction).

In the embodiment, the gate wiring width direction corresponds to the length direction of the gate electrode (the channel length direction of each transistor), and the gate wiring length direction corresponds to the width direction of the gate electrode (the channel width direction of each transistor).

As shown in FIG. 4B, the element isolation film 10 is embedded in the element isolation region STI. The element isolation film 10 containing a silicon oxide film is embedded in the groove formed in the silicon substrate 2 and has a top face projecting upward from the top face of the silicon substrate 2. That is, the structure of each element isolation film 10 is similar to the structure in the memory cell area M. As shown in FIG. 4A, a shield layer SLD is formed on the element isolation region STI between the active areas AA of the transistors WT adjacent in the gate wiring width direction. The shield layer SLD is formed along the gate wiring length direction. The shield layer SLD is supplied with 0 V or a given negative bias, for example, by the peripheral circuit PC, thereby suppressing a punch through leakage current in the gate wiring width direction and preventing field inversion, so that reliability is enhanced.

As shown in FIG. 4B, each of the transistors WT includes a gate insulating film 11 formed on the silicon substrate 2, a gate electrode PG formed on the gate insulating film 11, and source/drain regions S/D (see FIG. 4A) formed on the surface layer of the silicon substrate 2 at sides of the gate electrode PG. The source/drain regions S/D are positioned on sides of the gate electrode PG in a direction (depth direction) orthogonal to the gate electrode cross section shown in FIG. 4B, and is not shown in FIG. 4B.

The gate electrode PG includes a polysilicon layer 12 sandwiched between the element isolation films 10 adjacent in the gate wiring length direction, an insulating film 13 formed directly on the top face of the polysilicon layer 12, and a polysilicon layer 14 formed directly on the top face of the insulating film 13. The insulating film 13 is formed with a slit (through hole) so that the polysilicon layers 12 and 14 come in contact with each other through the slit.

In the embodiment, polysilicon is used as electrode CG, PG, but the gate electrode PG may be formed such that a metal silicide of tungsten, cobalt, etc., is formed on the top of the polysilicon layer 14. The gate electrode CG may be formed in a similar manner. In the embodiment, the polysilicon layer 4 is formed as the floating gate electrode FG, but a silicon nitride film may be used in place of the floating gate electrode FG to form an SONOS or a MONOS structure. Thus, the material for forming the gate electrode PG, MG may be appropriately changed.

The polysilicon layer 12 has a top face made flush with the top face of the element isolation film 10. The polysilicon layer 14 is shaped in a line having a given length in the gate wiring length direction and overhangs from the active area AA to the element isolation film 10. The gate electrode PG is formed on a channel region of the transistor WT through the gate insulating film 11.

One overhang part (one end part) $14a$ of the polysilicon layer 14 has an overhanging length L1 larger than a length L2 of an opposite overhang part (opposite end part) $14b$. That is, there is formed an asymmetrical structure of the overhang parts $14a$ and $14b$ having the different overhanging lengths L1 and L2 at both sides in the gate wiring length direction is formed. All of the overhang parts $14a$ are provided on the same side (in FIG. 4B, the left side) of the gate electrodes PG of the transistors WT.

A via plug 15 is formed on the overhang part $14a$ of each transistor WT. The via plugs 15 are formed above the element isolation regions STI. Each of the via plugs 15 is made of tungsten (W) and a barrier metal film covering tungsten and extends in a vertical direction.

A tungsten (W) layer 16 is formed as a conductive layer connecting the top faces of the via plugs 15. The tungsten (W) layer 16 functions as a transfer gate line TG. An interlayer insulating film 17 is formed between the polysilicon layers 12 and 14 and the tungsten layer 16. The interlayer insulating film 17 is formed of a silicon oxide film, for example. A barrier metal film (not shown) may be formed between the tungsten layer 16 and the interlayer insulating film 17.

Next, a manufacturing method of the structures described above will be discussed with reference to FIGS. 5A to 10B. FIGS. 5A, 6A, 7A, 8A, 9A and 10A represent the structure in the memory cell area M and FIGS. 5B, 6B, 7B, 8B, 9B and 10B represent the structure in the peripheral circuit area P.

In the embodiment, attention is given to the structures of the gate electrodes PG and MG and the manufacturing method thereof, and description for any other than the manufacturing method thereof will be appropriately omitted. As required, step for manufacturing the structure of any other area or region not described may be added, and some steps may be skipped or replaced.

First, the steps to forming of the structures shown in FIGS. 5A and 5B will be discussed briefly. To form wells 2a and 2b, impurity ions are implanted into a silicon substrate 2 in a memory cell area M and activated through a thermal process. And, to form a thick gate insulating film 11 for a high voltage transistor (transfer gate transistor WT), thermal oxidation process is performed on the top face of the silicon substrate 2. Next, in the memory cell area M, the gate insulating film 11 is peeled and thermal oxidation process is performed for the top face of the silicon substrate 2, thereby forming a gate insulating film 3 for a memory cell transistor MT thinner than the gate insulating film 11.

Next, using an LP-CVD method for the full face, a polysilicon layer 4 is deposited on the gate insulating film 3 in the memory cell area M, and a polysilicon layer 12 is deposited on the gate insulating film 11 in a peripheral circuit area P. Next, anisotropic etching is performed in both areas M and P to form element isolation grooves and a plurality of active areas AA. At this time, the active area AA in the memory cell area M is formed like a band and the active area AA in the peripheral circuit area P is formed like islands and the isolated areas are disposed like a matrix.

Next, an element isolation film 10 is embedded in the element isolation groove and the top face position of the element isolation film 10 is adjusted. At this time, in the memory cell area M, the top face of the element isolation film 10 is adjusted to a position below the top face of the polysilicon layer 4 and above the top face of the gate insulating film 3. In the peripheral circuit area P, the top face of the element isolation film 10 is adjusted to a position almost match the top face of the polysilicon layer 12.

Next, materials of inter-gate insulating films 5 and 13, polysilicon layers 6 and 14, a silicon nitride film 21 are deposited in order. A photo resist 31 is applied on the silicon nitride film 21 and formed into the shape of gate electrode 22 with photolithography technique. The inter-gate insulating film 13 in the peripheral circuit area P is formed with a slit to connect the polysilicon layers 12 and 14 with each other.

Figure 6A:
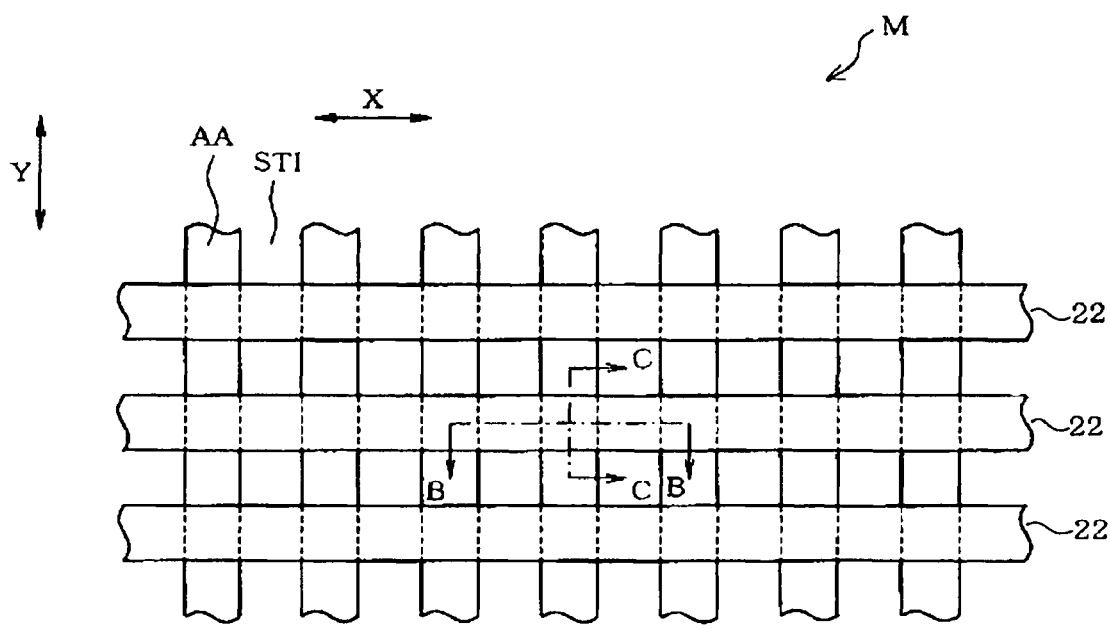
FIG. 6A is a plan view illustrating a pattern formation state in the memory cell area.
Figure 6B:
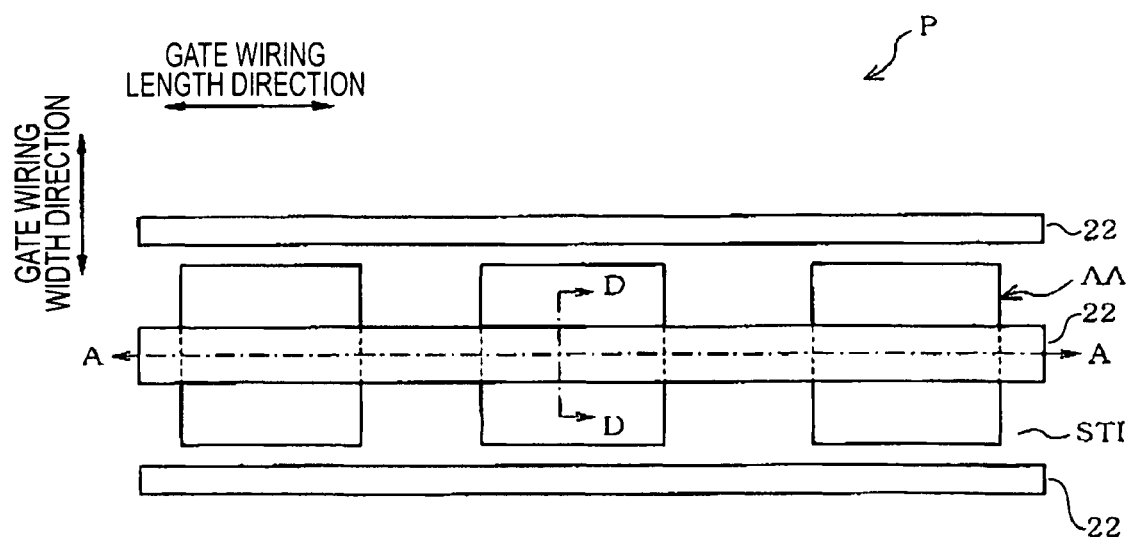
FIG. 6B is a plan view illustrating a pattern formation state in the peripheral circuit area.

FIG. 6A is a plan view to show the patterns of gate electrode 22 in the memory cell area M at this stage, and FIG. 6B is a plan view to show the patterns of gate electrode 22 in the peripheral circuit area P at this stage. As shown in FIGS. 6A and 6B, the patterns of gate electrode 22 are formed to extend in the lateral direction in the figure (X direction, gate wiring length direction) in each of the areas M and P and are spaced from each other in the longitudinal direction crossing the lateral direction (Y direction, gate wiring width direction). In the embodiment, the X direction matches the gate wiring length direction and the Y direction matches the gate wiring width direction.

Particularly in the peripheral circuit area P, as shown in FIG. 6B, one of gate electrode 22 is formed so as to cross the center of the island-shaped active area AA in one direction. An other gate electrode 22 is formed above an element isolation region STI, and is positioned at a distance from the gate electrode 22 crossing the active area AA in the extending direction thereof.

FIGS. 7A and 7B show cross sections taken along line C-C in FIG. 6A and taken along line D-D in FIG. 6B. As shown in FIGS. 7A and 7B, in the memory cell area M, the silicon nitride film 21, the polysilicon layer 6 forming a control gate electrode CG, the inter-gate insulating film 5, and a floating gate electrode FG (polysilicon layer 4) are anisotropically etched with the photo resist 31 as a mask. At the same time, in the peripheral circuit area P, the silicon nitride film 21, the polysilicon layer 14 forming a gate electrode PG, the inter-gate insulating film 13, and the polysilicon layer 12 are anisotropically etched with the photo resist 31 as a mask.

As the etching is performed, the control gate electrode CG, the inter-gate insulating film 5 and the floating gate electrode FG are divided into pieces in the memory cell area M, and the gate electrode PG is divided into pieces in the peripheral circuit area P. The photo resist 31 is removed through ashing process, etc.

Figures 5A, 5B:
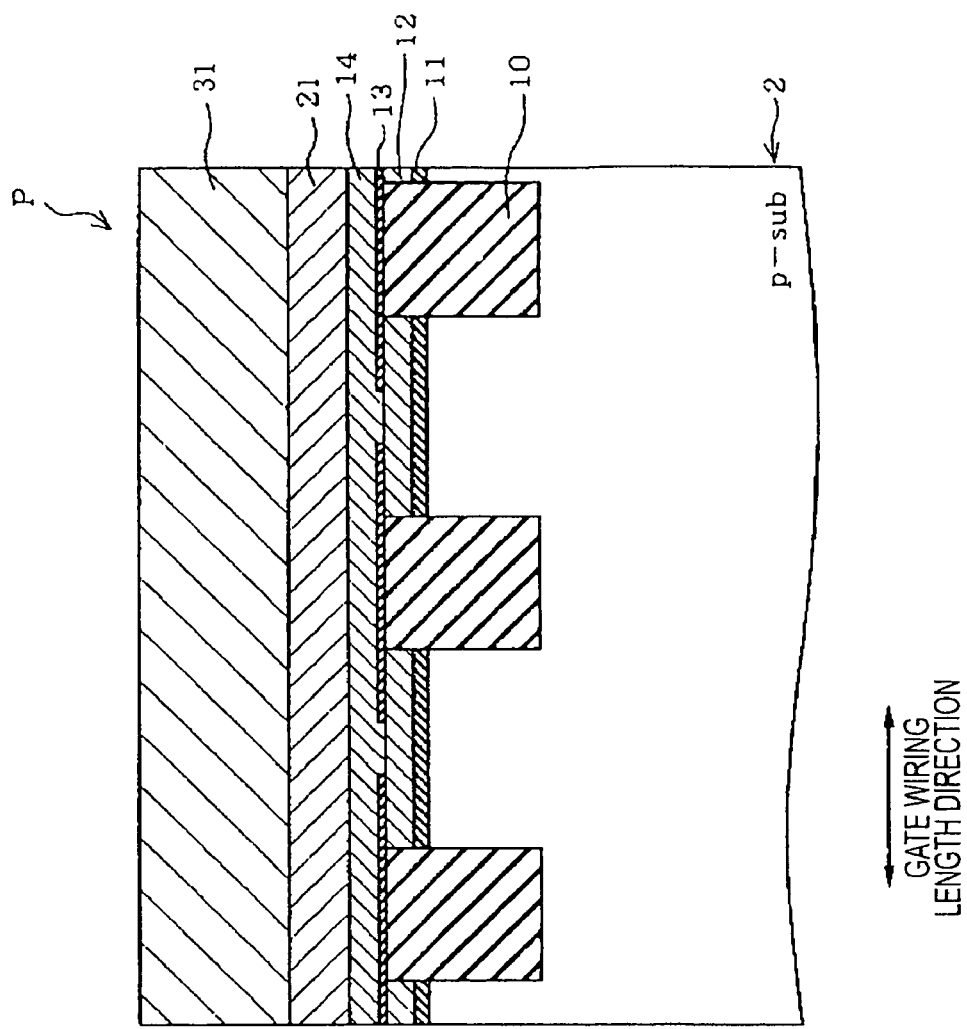
FIGS. 5A and 5B are cross-sectional views in a manufacturing step, FIG. 5A showing the memory cell area, FIG. 5B showing the peripheral circuit area.
Figure 8A:
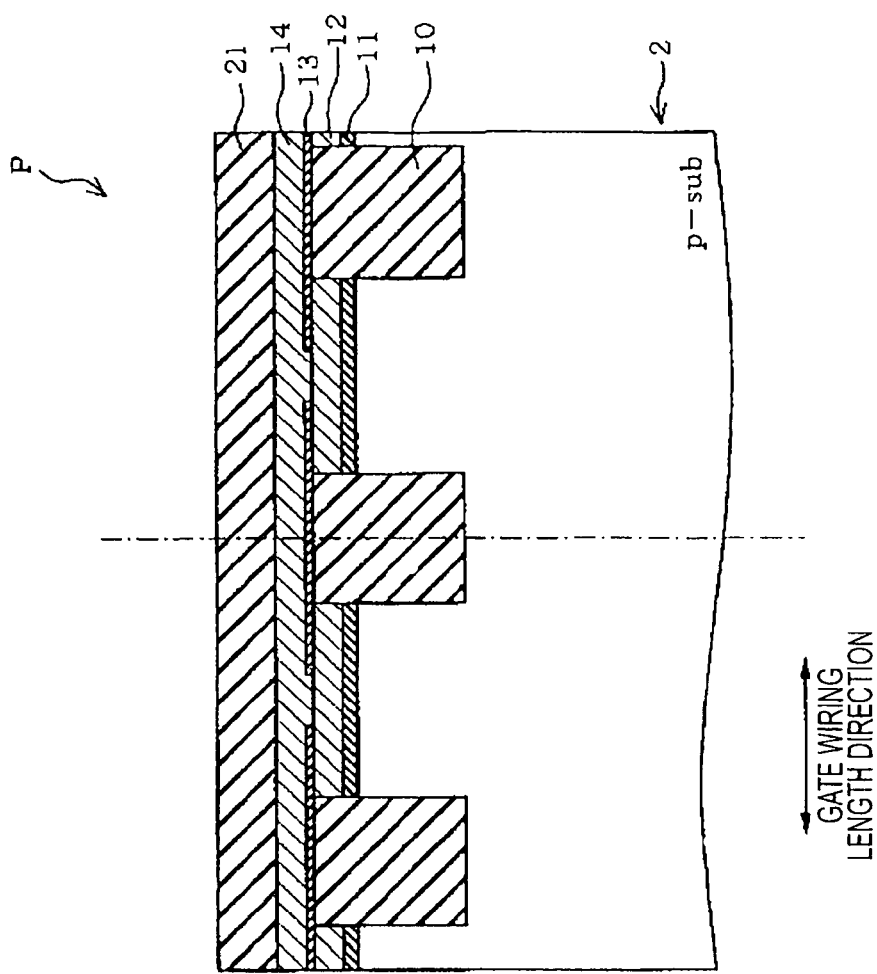
FIGS. 8A and 8B are cross-sectional views in a manufacturing step, FIG. 8A showing the memory cell area, FIG. 8B showing the peripheral circuit area.
Figure 8B:
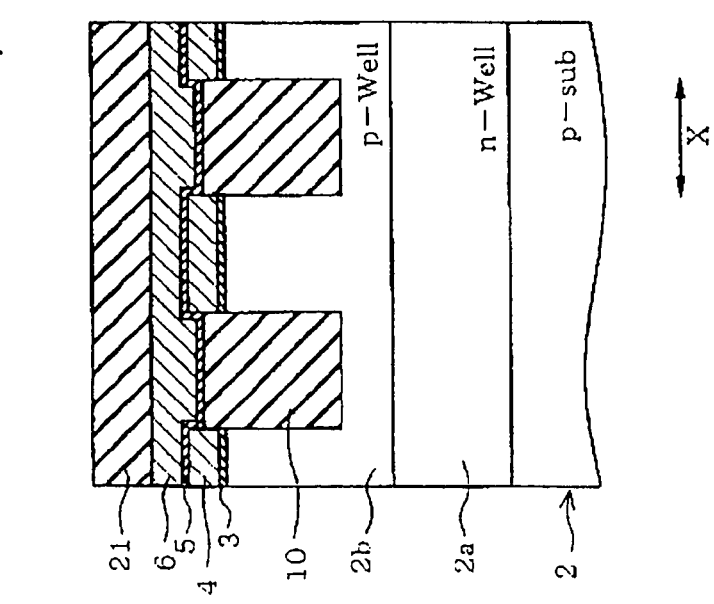

At this time, in the cross section taken along line B-B in FIG. 6A and the cross section taken along line A-A in FIG. 6B, the structures are formed as photo resist 31 is removed from the cross section structures shown in FIGS. 5A and 5B and thus the films 3 to 6, 21 and 11 to 14 are left as shown in FIGS. 8A and 8B.

Figure 10A:
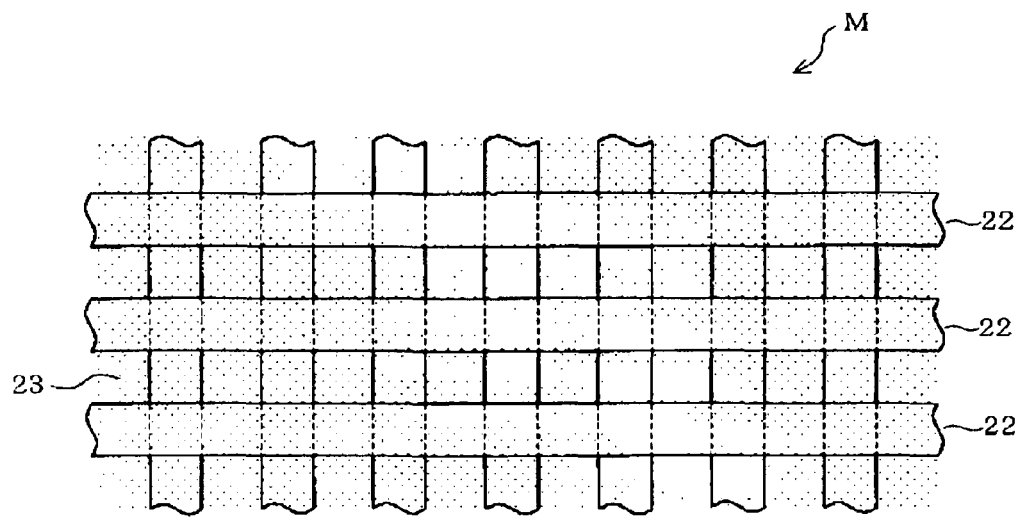
FIG. 10A is a plan view illustrating a pattern formation state in the memory cell area.
Figure 10B:
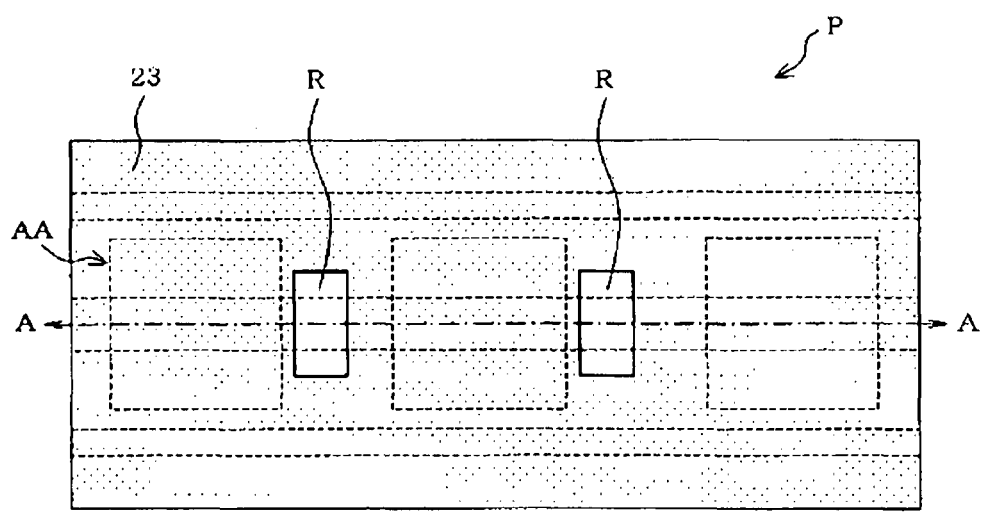
FIG. 10B is a plan view illustrating a pattern formation state in the peripheral circuit area.

Next, as shown in FIGS. 9A and 9B, a photo resist pattern 23 is formed. The photo resist pattern 23 is shown in FIGS. 10A and 10B. In FIGS. 10A and 10B, the hatched area is an area covered with the photo resist pattern 23.

The photo resist pattern 23 is formed to cover the whole memory cell area M, and to cover the peripheral circuit area P except the opening areas R that are formed to divide the polysilicon layer 14 and the silicon nitride film 21 covering and crossing the center of the active area AA in the gate wiring length direction on a part of the element isolation region STI. In the embodiment, the opening areas R are formed as the same width in the gate wiring length direction and are equally spaced from each other with respect to the gate wiring length direction.

As viewed from above, the opening areas R of the photo resist pattern 23 are positioned on a part of the element isolation region STI. As shown in FIG. 10B, the opening areas R of the photo resist pattern 23 are formed so that the centers thereof in the gate wiring length direction each shifts in the gate wiring length direction from the center between the adjacent active areas AA and AA.

Figure 11A:
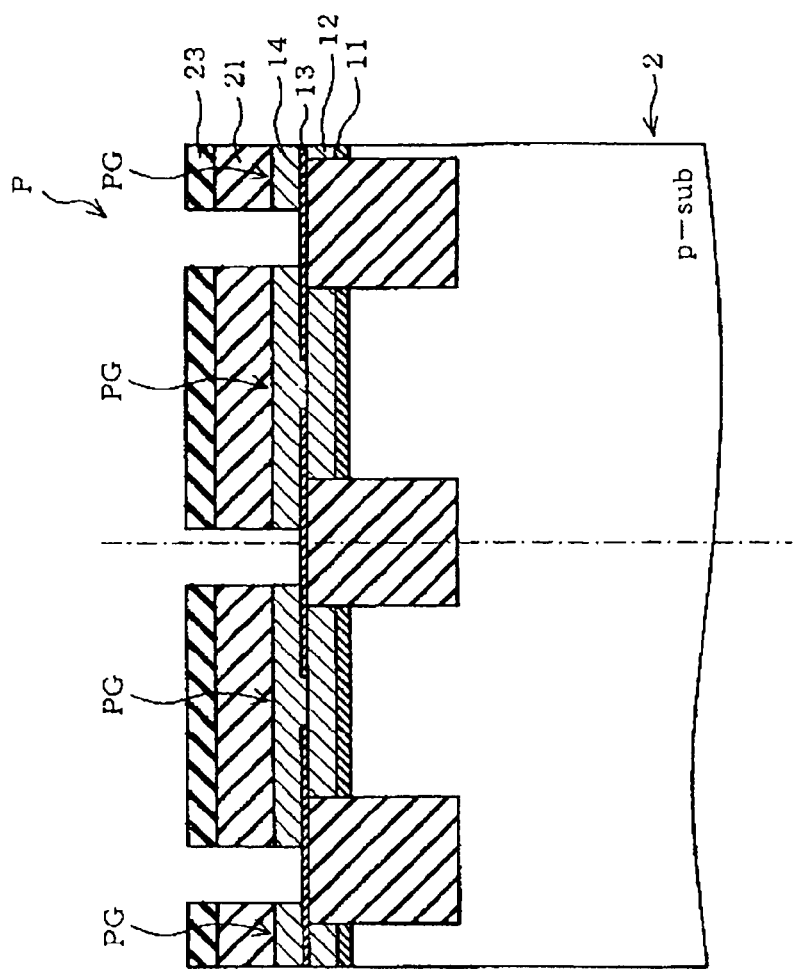
FIGS. 11A and 11B are cross-sectional views in a manufacturing step, FIG. 11A showing the memory cell area, FIG. 11B showing the peripheral circuit area.
Figure 11B:
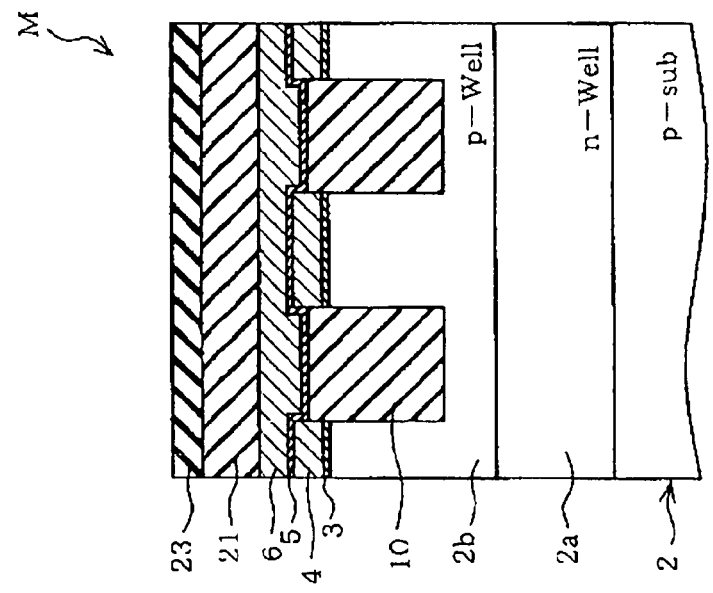

Next, as shown in FIGS. 11A and 11B, the silicon nitride film 21 and the polysilicon layer 14 are anisotropically etched with the photo resist pattern 23 as a mask. As the etching is performed, in the peripheral circuit area P, the gate electrode PG of the transistor WT is divided into pieces, as shown in FIG. 11B.

Then, the photo resist pattern 23 is removed using ashing process, etc. The polysilicon layers 6 and 14 are thus formed as the memory cell gate electrode MG, select gate electrode SG and the gate electrode PG in the peripheral circuit area P. After this, step of removing the silicon nitride film 21, step of silicidation for the tops of the polysilicon layers 6 and 14, step of embedding an interlayer insulating film 17 between the gate electrodes MG, SG, PG, step of forming a barrier film for suppressing passage of impurities, step of forming a plug of a bit line contact CB, a source line contact CS, a via plug 15 (tungsten), etc., step of forming a tungsten layer 16 (transfer gate line TG), and the like are performed as required.

A method for structurally connecting the via plugs 15 onto the top faces of the gate electrodes PG will be discussed with reference to FIGS. 4A and 4B. After the gate electrodes MG, SG and PG are formed, the interlayer insulating film 17 is deposited using a CVD method. Next, a photo resist pattern (not shown) is formed on the top face of the interlayer insulating film 17 and anisotropic etching is performed, thereby forming via holes to reach the top faces of the gate electrodes PG.

At this time, as shown in FIGS. 4A and 4B, since via holes are formed on the element isolation region STI as viewed from above, if a slight mask misalignment occurs in the gate wiring width direction, the fear that the via hole may reach the top of the active area AA is eliminated. Therefore, if tungsten is embedded in the via hole as constituent material of the via plug 15, the fear that the via plug 15 may come in structural contact with the active area AA is eliminated. That is, by forming the via plug 15 on the element isolation region STI as viewed from above, a misalignment margin can be made large and the reliability of lithography process can be enhanced.

Next, the via plugs 15 are planarized on the top face of the interlayer insulating film 17 by a CMP (Chemical Mechanical Polishing) method, and the tungsten layer 16 is formed using the CVD method over the interlayer insulating film 17 and the via plugs 15. The flash memory unit 1 can be thus formed.

Figure 12:
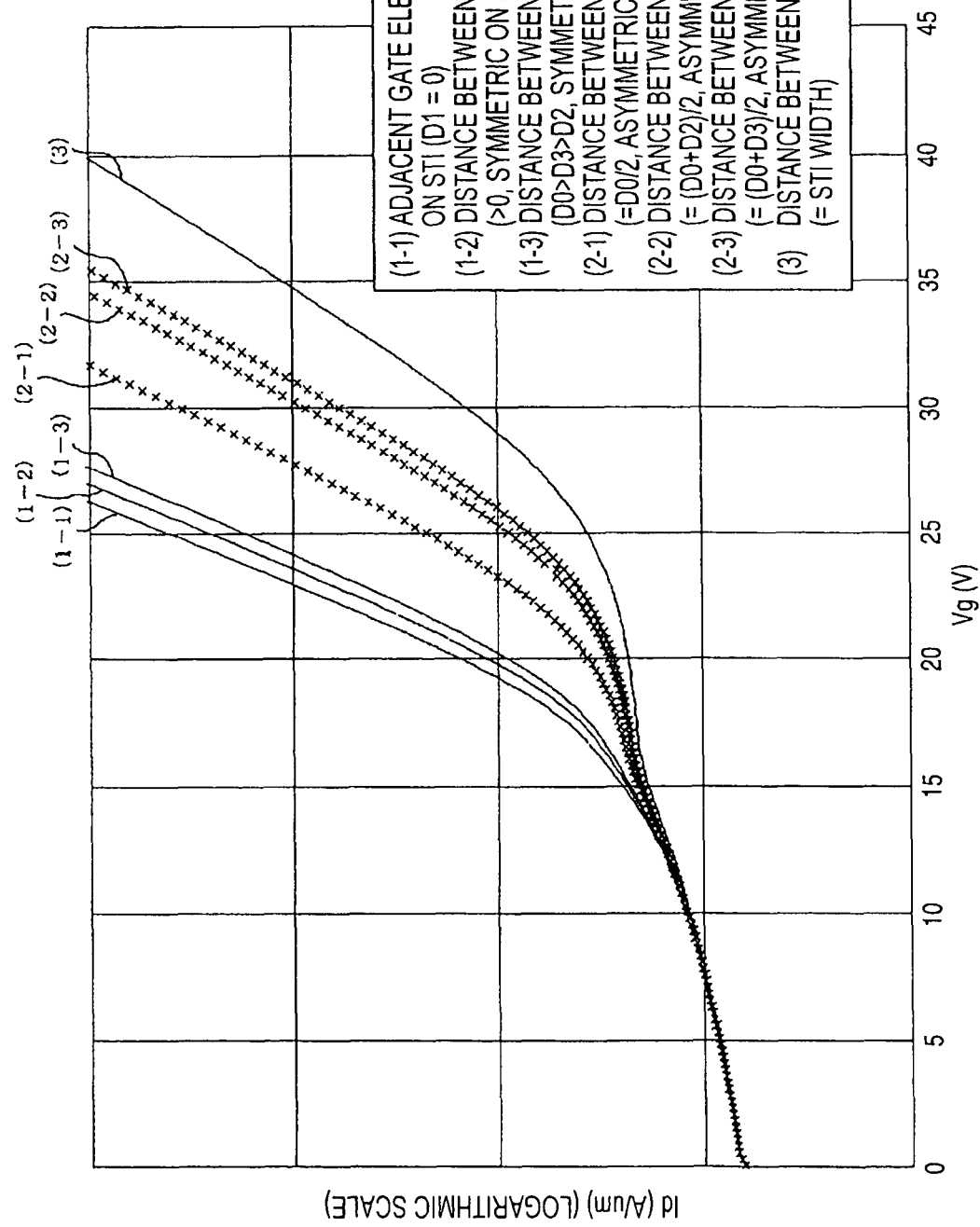
FIG. 12 illustrates the simulation result.

The inventor et al. simulate the structures thus formed. FIG. 12 shows the simulation result of leakage current Id-gate voltage Vg for the above-described asymmetric gate structure and a symmetric gate structure as a comparison example. When a voltage Vg is applied to the gate electrode PG, a current is detected between the drains D and D of the adjacent transistors WT (see FIGS. 4A and 4B). In the simulation shown in FIG. 12, a current flowing between the drains D and D of the transistors WT and WT adjacent in the gate wiring length direction is shown as current Id, with respect to a voltage Vg applied to the gate wiring connecting the gate electrodes PG and PG of the adjacent transistors WT and WT.

The data shown in FIG. 12 indicates the simulation result obtained in the following simulation conditions:

(1-1) where the gate electrodes PG and PG (14) adjacent in the gate wiring length direction are structurally connected (distance therebetween D1=0);

(1-2) where distance between the gate electrodes adjacent in the gate wiring length direction is D2 (>D1), and symmetric structure (length L1 of overhang part 14a=length L2 of overhang part 14b) is applied;

(1-3) where distance between the gate electrodes adjacent in the gate wiring length direction is D3 (D0>D3>D2, D0 is the gate wiring length direction width of the element isolation region STI), and symmetric structure (L1=L2) is applied;

(2-1) where distance between the gate electrodes adjacent in the gate wiring length direction is D4 (=D0/2), and asymmetric structure (L1≠L2) is applied;

(2-2) where distance between the gate electrodes adjacent in the gate wiring length direction is D5 (=(D0+D2)/2), and asymmetric structure (L1≠L2) is applied;

(2-3) where distance between the gate electrodes adjacent in the gate wiring length direction is D6 (=(D0+D3)/2), and asymmetric structure (L1≠L2) is applied; and (3) where distance between the gate electrodes adjacent in the gate wiring length direction is D0 (almost the same width as the width of the element isolation region STI).

As shown in FIG. 12, while the current Id increases as the applied voltage Vg to the gate electrode PG increases, the trend is changed according to the overhang lengths L1 and L2 of the overhang parts 14a and 14b.

As shown in the simulation result, to reduce the leakage current between the gate electrodes PG, it is ideal to enlarge the distance between the gate electrodes to the distance D0, that is, to the width of the element isolation region STI. However, if the flash memory unit is designed so that the gate electrode PG is closely aligned with the end part of the active area AA, a misalignment margin is reduced.

By applying any of the asymmetric structures in (2-1) to (2-3), the misalignment margin can be enlarged. Moreover, by applying the asymmetric structure, leakage current can be suppressed as compared with the case where a symmetric structure as shown in (1-1) to (1-3) is applied. Therefore, to suppress the leakage current, it is preferable to set the overhang lengths of the overhang parts 14a and 14b to the different lengths L1 and L2.

In the embodiment, the active areas AA each contains the source S, the drain D and the channel region therebetween and are divided like islands, and the element isolation film 10 is embedded in each element isolation region STI. Since the gate electrode PG extending along the gate wiring length direction on the active area AA is formed to have the overhang parts 14a and 14b of the different lengths, the leakage current flowing between the adjacent transistors WT and WT can be suppressed.

In the embodiment, since the gate electrodes PG are formed in the same length in the gate wiring length direction, the characteristic variations between the transistors WT can be suppressed, and the element characteristics can be made almost the same.

In the embodiment, the overhang lengths L1 of the overhang parts 14a of the polysilicon layers 14 extended in one side direction of the gate wiring length direction (the left direction in FIG. 4B) are formed as the same length, so that variations between the transistors WT can be suppressed, and the element characteristic can be held uniform.

In the embodiment, the overhang lengths L2 of the overhang parts 14b of the polysilicon layers 14 extended in the opposite direction to the one side direction of the gate wiring length direction (the right direction in FIG. 4B) are formed as the same length, so that variations between the transistors WT can be suppressed, and the element characteristic can be held uniform.

In the embodiment, the ends of the overhang parts 14a are arranged at the same position in the gate wiring width direction between each adjacent transistors WT and WT (the vertical direction in FIG. 4A), so that variations between the transistor elements can be suppressed, and the characteristics of the transistor WT elements provided side by side in the gate wiring width direction can be held uniform. The ends of the overhang parts 14a need not necessarily be arranged at the same position.

In the embodiment, the ends of the overhang parts 14b are arranged at the same position in the gate wiring width direction between each adjacent transistors WT and WT (the vertical direction in FIG. 4A), so that variations between the transistor elements can be suppressed, and the characteristics of the transistor WT elements provided side by side in the gate wiring width direction can be held uniform. The ends of the overhang parts 14b need not necessarily be arranged at the same position.

In the embodiment, the via plug 15 is formed on the overhang part 14a of the gate electrode PG overhanging onto the element isolation film 10, so that the fear that the via plug 15 comes in contact with the active area AA due to misalignment caused by lithography process is eliminated.

Further, since it is not necessary to provide the shield layer SLD between the adjacent transistors WT and WT for shield in the gate wiring length direction, the design rules regarding the distance between the active areas AA and AA in the gate wiring length direction can be relaxed as compared with the structure in JP-2006-059978-A.

Further, since the gate electrode is asymmetrically divided at either one side offset form a center of the element isolation region STI in the gate wiring length direction, field inversion can be prevented even if the element isolation region STI is formed shallowly.

Second Embodiment

Figure 13A:
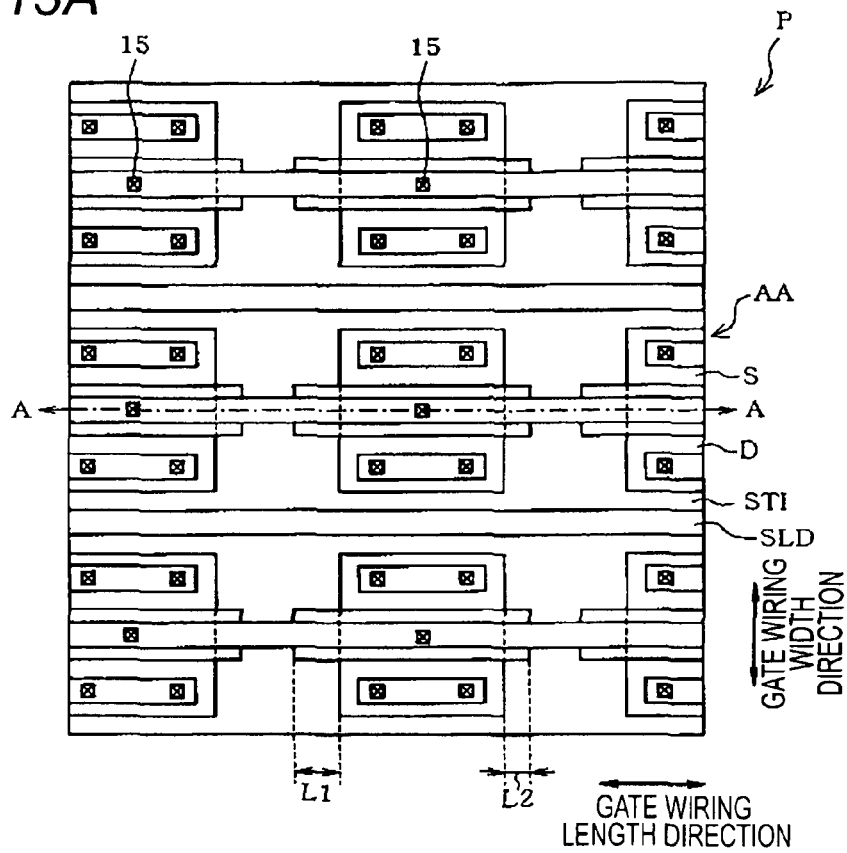
FIGS. 13A and 13B illustrate a second embodiment of the invention in a similar manner with FIGS. 4A and 4B.
Figure 13B:
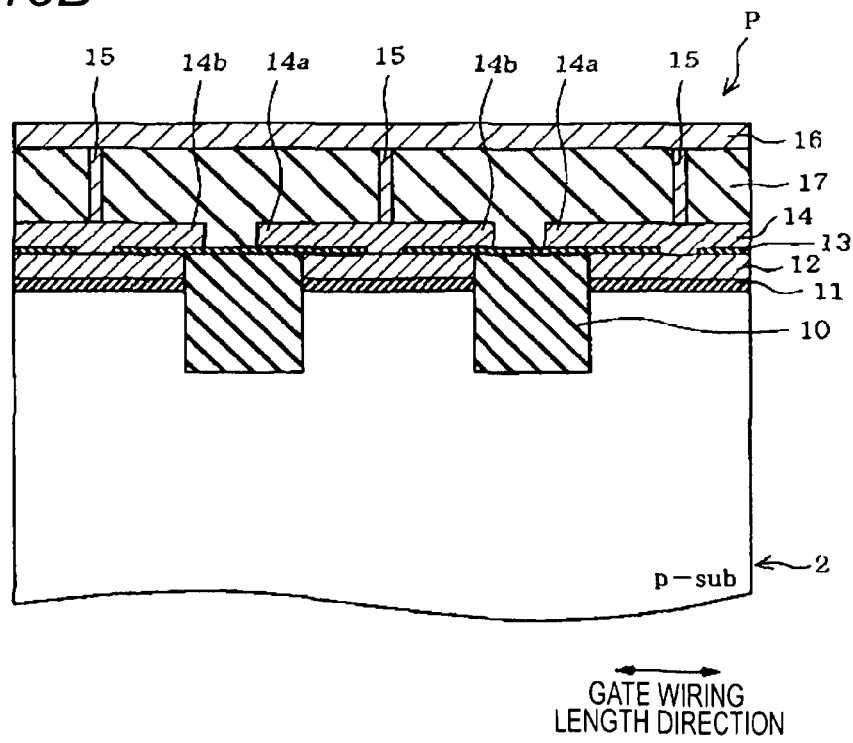

FIGS. 13A and 13B show a second embodiment of the invention. The second embodiment differs from the first embodiment in that a via plug is formed on a gate electrode above a channel region. As shown in FIGS. 13A and 13B, a via plug 15 is formed directly on a polysilicon layer 14 forming a gate electrode PG and is positioned above a channel region of a transistor WT. Parts identical with those of the first embodiment described above are denoted by the same reference numerals and will not be discussed again. The second embodiment produces almost similar advantages to those of the first embodiment.

Third Embodiment

Figure 14A:
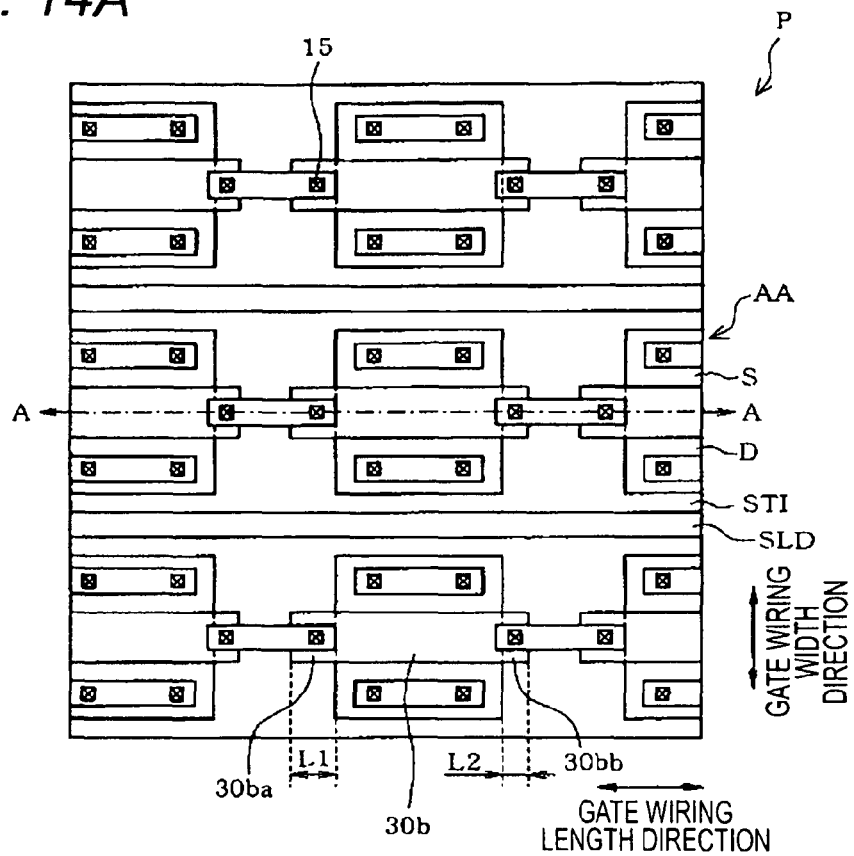
FIGS. 14A and 14B illustrate a third embodiment of the invention in a similar manner with FIGS. 4A and 4B.
Figure 14B:
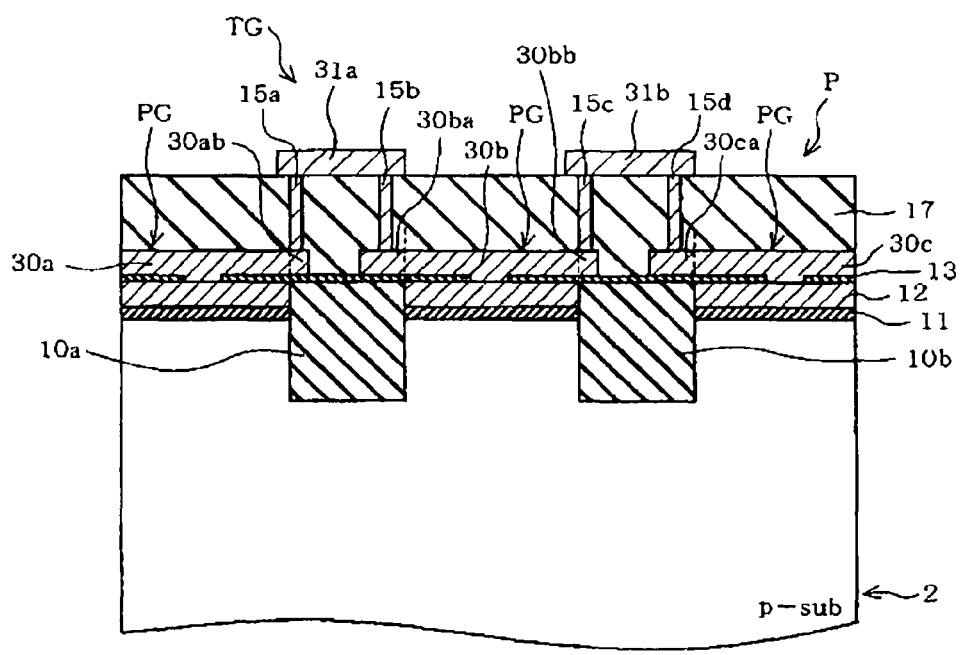

FIGS. 14A and 14B show a third embodiment of the invention. The third embodiment differs from the embodiments described above in that a connect gate line (transfer gate line) over via plugs is divided for each two adjacent gate electrodes. Parts identical with those of the embodiments described above are denoted by the same reference numerals or similar reference numerals with any suffix of a to d as required and will not be discussed again.

As shown in FIGS. 14A and 14B, polysilicon layers 30a, 30b and 30c are formed as conductive layers in place of polysilicon layers 14. The top of each of the polysilicon layers 30a to 30c may be silicided using metal such as tungsten or cobalt as in the embodiments described above.

The polysilicon layer 30a has an overhang part 30ab overhanging onto one end side of an element isolation film 10a. The polysilicon layer 30b has an overhang part 30ba overhanging onto the opposite end side of the element isolation film 10a and an overhang part 30bb overhanging onto one end side of an element isolation film 10b.

The polysilicon layer 30c has an overhang part 30ca overhanging onto one end side of the element isolation film 10b. The overhang part 30ca is formed in the same length L1 as the overhang part 30ba. The overhang part 30ab is formed in the same length L1 as the overhang part 30bb. The overhang part 30ab is formed in a length L2 smaller than the length L1 of the overhang part 30ba. The overhang part 30bb is formed in the length L2 smaller than the length L1 of the overhang part 30ca.

A via plug 15a is formed directly on the top face of the overhang part 30ab of the polysilicon layer 30a. A via plug 15b is formed directly on the top face of the overhang part 30ba of the polysilicon layer 30b. A via plug 15c is formed directly on the top face of the overhang part 30bb of the polysilicon layer 30b. A via plug 15d is formed directly on the top face of the overhang part 30ca of the polysilicon layer 30c.

The via plugs 15a to 15d are formed in the same layer and have almost the same height. A tungsten layer 31a connects the top faces of the via plugs 15a and 15b. A tungsten layer 31b connects the top faces of the via plugs 15c and 15b. The tungsten layers 31a and 31b are structurally divided on the top face of an interlayer insulating film 17 on the polysilicon layer 30b.

Therefore, the via plugs 15a to 15d connect the polysilicon layers 30a to 30c and the tungsten layers 31a and 31b, thereby forming a transfer gate line TG. In this case, a current flowing into the transfer gate line TG flows to the polysilicon layer 30a→the via plug 15a→the tungsten layer 31a→the via plug 15b→the polysilicon layer 30b→the via plug 15c→the tungsten layer 31b→the via plug 15d→the polysilicon layer 30c in order; the current flows in a zigzag over the upper and lower layers.

The embodiment provides the following structural feature: The polysilicon layer 30b of a gate electrode PG formed through a gate insulating film 11 on an active area AA includes the overhang part 30ba overhanging in the given length L1 onto the element isolation film 10a positioned on one side of the active area AA and the overhang part 30bb overhanging in the given length L2 smaller than the given length L1 onto the element isolation film 10b positioned on an opposite side to the one side of the active area AA. The polysilicon layer 30c of another gate electrode PG includes the overhang part 30ca overhanging in the given length L1 onto the element isolation film 10b positioned on one side of the active area AA and an overhang part overhanging in the given length L2 onto the element isolation film on an opposite side although not shown. The via plugs 15b, 15c and 15d are formed on the overhang parts 30ba, 30bb and 30ca respectively. The tungsten layer 31b is connected to the via plugs 15c and 15d and is not structurally connected to any other via plug (15a, 15b, etc.,).

By applying such a structure, almost similar advantages to those of the embodiments described above are provided. Moreover, the antenna ratio according to the wiring pattern can be decreased and the risk of breaking transistors by damage caused due to the voltage charged during a manufacturing flow can be decreased.

As a manufacturing method of the structure, one tungsten layer is formed by a CVD method, and then, etching is performed so as to structurally divide the one tungsten layer into the connected tungsten layers 31a and 31b. The structure can be thus manufactured.

According to an aspect of the present invention, the leakage current can be suppressed without increasing the depth of the element isolation region.

What is claimed is:

1. A semiconductor device comprising:
   a semiconductor substrate;
   a plurality of active areas with island-like shapes formed on the semiconductor substrate;
   an element isolation area configured to surround the plurality of active areas, the element isolation area including an element isolation groove formed on the semiconductor substrate and an element isolation film embedded into the element isolation groove;
   a plurality of gate insulating films, each gate insulating film formed on corresponding one of the plurality of active areas, respectively; and
   a plurality of gate electrodes, each gate electrode formed on corresponding one of the plurality of gate insulating films, respectively, and having a first end portion that overhangs from the corresponding active area onto the element isolation area at one side and a second end portion that overhangs from the corresponding active area onto the element isolation area at the other side,
   wherein an overhang of the first end portion has a different length from a length of an overhang of the second end portion, and
   wherein, among a neighboring pair of the gate electrodes, the first end portion of one gate electrode and the second end portion of the other gate electrode face with each other over the element isolation area, and wherein an overhanging length of the first end portion is larger than that of the second end portion in each gate electrode;
said semiconductor device further comprising a plurality of first via plugs formed on the plurality of gate electrodes at the first end portion, respectively.

2. The semiconductor device according to claim 1,
wherein the plurality of active areas are arranged in a pre-determined direction, and
wherein the plurality of gate electrodes each extends in the pre-determined direction.

3. The semiconductor device according to claim 2, further comprising:
   a plurality of upper wirings, each connects ones of the plurality of first via plugs of the gate electrodes adjacent in the pre-determined direction, respectively.

4. The semiconductor device according to claim 2, further comprising:
   a plurality of first via plugs formed on the plurality of gate electrodes at the first end portion, respectively; and
   a plurality of second via plugs formed on the plurality of gate electrodes at the second end portion, respectively.

5. The semiconductor device according to claim 1,
wherein each gate electrode comprises:
a lower gate conductor formed on the gate insulating film;
an inter gate insulating film formed on the lower gate conductor; and
an upper gate conductor, having the first and the second end portions, formed on the inter gate insulating film, the upper gate conductor electrically connected with the lower gate conductor through a slit formed in the inter gate insulating film.

6. The semiconductor device according to claim 2,
wherein the plurality of gate electrodes are formed to have the same length in the pre-determined direction.

7. The semiconductor device according to claim 2,
wherein top faces of the element isolation films are formed to be higher than that of the active areas.

8. The semiconductor device according to claim 4, further comprising:
   a plurality of upper wirings, each wiring connects the first via plug of one of the gate electrodes and the second via plug of another of the gate electrodes being adjacent to the one of the gate electrodes in the pre-determined direction.

9. A semiconductor device comprising:
a semiconductor substrate;
a first active area formed on the semiconductor substrate;
a shallow trench isolation configured to surround the first active area;
a first gate insulating film formed on the first active area;
a first gate electrode formed on the first gate insulating film, which has a first projection portion above the shallow trench isolation at one side and a second projection portion above the shallow trench isolation at the other side;
a second active area formed on the semiconductor substrate on the side of the first projection portion of the first gate electrode apart from the first active area with a pre-determined distance in a pre-determined direction;
a second gate insulating film formed on the second active area; and
a second gate electrode formed on the second gate insulating film, which has a first projection portion above the shallow trench isolation at the opposite side from the first active area and a second projection portion above the shallow trench isolation between the first active area and the second active area,
wherein the first projection portion has a different length in a direction of the gate electrode from a length of the second projection portion in each gate electrode, and
wherein, among a neighboring pair of the gate electrodes, the first projection portion of one gate electrode and the second projection portion of the other gate electrode face with each other over an element isolation area;
said semiconductor device further comprising a first via plug formed on the longer projection portion.

10. The semiconductor device according to claim 9,
wherein a length of the second gate electrode in the pre-determined direction is the same as that of the first gate electrode.

11. The semiconductor device according to claim 9,
wherein the first gate electrode comprises:
a lower gate conductor formed on the gate insulating film;
an inter gate insulating film formed on the lower gate conductor; and
an upper gate conductor, having the first projection portion and the second projection portion, formed on the inter gate insulating film, the upper gate conductor electrically connected with the lower gate conductor through a slit formed in the inter gate insulating film.

12. The semiconductor device according to claim 10,
wherein a length of the first projection portion of the second gate electrode is the same as the length of the first projection portion of the first gate electrode, and
wherein a length of the second projection portion of the second gate electrode is the same as the length of the second projection portion of the first gate electrode.

\* \* \* \* \*